(12) United States Patent
Furukawa

(10) Patent No.: US 9,355,812 B2
(45) Date of Patent: May 31, 2016

(54) PROCESSING APPARATUS AND PROCESSING METHOD

(71) Applicant: KABUSHIKI KAISHA TOSHIBA, Minato-Ku, Tokyo (JP)

(72) Inventor: Shinichi Furukawa, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/481,703

(22) Filed: Sep. 9, 2014

(65) Prior Publication Data

US 2015/0348740 A1 Dec. 3, 2015

Related U.S. Application Data

(60) Provisional application No. 62/006,537, filed on Jun. 2, 2014.

(51) Int. Cl.
*H01J 37/00* (2006.01)
*H01J 37/147* (2006.01)
*H01J 37/21* (2006.01)

(52) U.S. Cl.
CPC ............. *H01J 37/1471* (2013.01); *H01J 37/21* (2013.01); *H01J 2237/049* (2013.01); *H01J 2237/303* (2013.01)

(58) Field of Classification Search
USPC ........................................................ 250/492.2
See application file for complete search history.

(56) References Cited

U.S. PATENT DOCUMENTS

| 4,019,109 | A | * | 4/1977 | McCoy | G03F 9/70 248/425 |
| 6,586,754 | B1 | * | 7/2003 | Hultermans | G03F 7/70691 250/492.2 |
| 7,087,352 | B2 | * | 8/2006 | Fay et al. | 430/22 |
| 7,127,810 | B2 | * | 10/2006 | Kasuga | B23K 26/0608 250/548 |
| 7,256,358 | B2 | * | 8/2007 | Kesselman | G01G 23/3721 177/177 |
| 7,973,280 | B2 | | 7/2011 | Takahashi et al. | |
| 8,277,603 | B2 | | 10/2012 | Tamamushi et al. | |
| 2015/0204832 | A1 | * | 7/2015 | Ochi | G01N 21/3554 702/30 |

FOREIGN PATENT DOCUMENTS

JP 11297265 A 10/1999

* cited by examiner

*Primary Examiner* — Phillip A Johnston
(74) *Attorney, Agent, or Firm* — Holtz, Holtz & Volek PC

(57) ABSTRACT

A processing apparatus according to the present embodiment includes a piezoelectric sensor unit, an irradiating unit, a calculating unit, a moving unit, and a controlling unit. The piezoelectric sensor unit is mounted with an object and outputs an electric signal corresponding to a pressure due to the weight of the object. The irradiating unit irradiates a portion of the object on the piezoelectric sensor unit with a beam. The calculating unit calculates a first amount of misregistration between the portion of the object which should be irradiated with the beam and an actual position irradiated by the beam on the basis of the electric signal from the piezoelectric sensor unit. The moving unit moves the irradiating unit. The controlling unit controls the irradiating unit or the moving unit in accordance with the first amount of misregistration.

19 Claims, 7 Drawing Sheets

PROCESSING APPARATUS AND PROCESSING METHOD

CROSS REFERENCE TO RELATED APPLICATIONS

This application is based upon and claims the benefit of priority from the prior U.S. Provisional Patent Application No. 62/006,537 filed on Jun. 2, 2014, the entire contents of which are incorporated herein by reference.

FIELD

The present embodiment relates to a processing apparatus and a processing method.

BACKGROUND

When an object is processed by using a beam such as a FIB (Focused Ion Beam), the object may move on a stage due to the difference of temperatures of the object and the stage on which the object is mounted. This is called drift phenomenon. When the drift phenomenon occurs, a position irradiated by the beam deviates from the location of the object to be processed, and the location of the object to be processed may not be irradiated with the beam.

DETAILED DESCRIPTION

Embodiments will now be explained with reference to the accompanying drawings. The present invention is not limited to the embodiments. In the embodiments, "an upper direction" or "a lower direction" refers to a relative direction when a direction of a surface of a piezoelectric sensor 12 on which an object 1 is provided is assumed as "an upper direction."

According to one embodiment, a processing apparatus includes a piezoelectric sensor unit, an irradiating unit, a calculating unit, a moving unit, and a controlling unit. The piezoelectric sensor unit is mounted with an object, and outputs an electric signal corresponding to the pressure due to the weight of the object. The irradiating unit irradiates a portion of the object on the piezoelectric sensor unit with a beam. The calculating unit calculates a first amount of misregistration between the portion of the object which should be irradiated with the beam and an actual position irradiated by the beam, on the basis of the electric signal from the piezoelectric sensor unit. The moving unit moves the irradiating unit. The controlling unit controls the irradiating unit or the moving unit in accordance with the first amount of misregistration.

First Embodiment (1) Processing Apparatus According to First Embodiment

Figure 1:
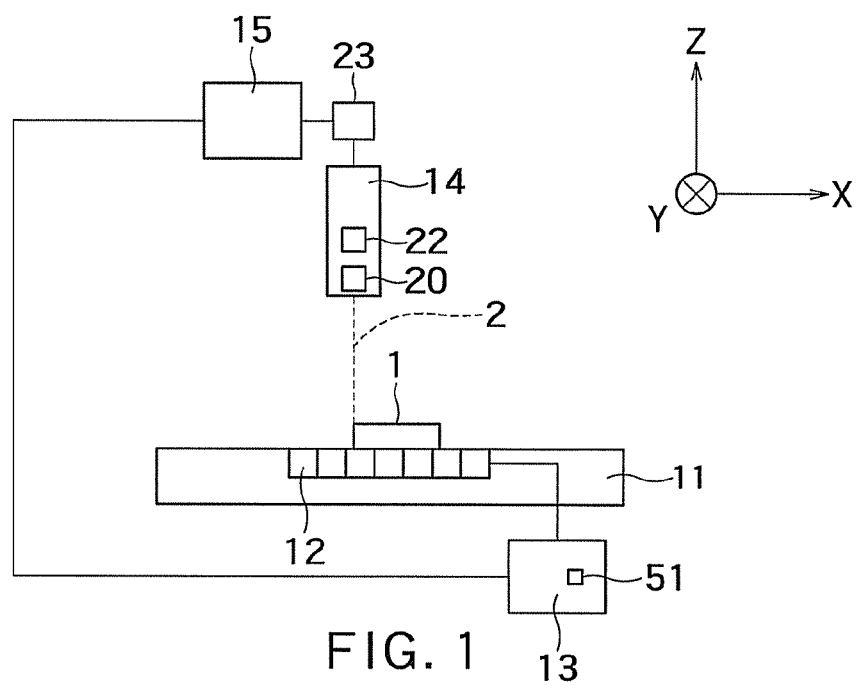
FIG. 1 is a diagram showing an example of the configuration of a processing apparatus according to a first embodiment.

FIG. 1 is a diagram showing an example of the configuration of a processing apparatus according to the first embodiment. The processing apparatus according to the present embodiment is, for example, an FIB processing apparatus for processing an object 1 using a focused ion beam (FIB) 2 (hereafter, also merely referred to as beam 2). The processing apparatus according to the present embodiment includes a stage 11, a piezoelectric sensor unit 12, an obtaining unit 13 as a calculating unit, an irradiating unit 14, a controlling unit 15, and a moving unit 23. Each component of the processing apparatus is connected with one another via a bus so as to communicate with one another.

(Stage 11)

The stage 11 includes the piezoelectric sensor unit 12 on the portion of which the object 1 is mounted, and supports the piezoelectric sensor 12. The object 1 is a body to be processed using the FIB, and the material of which is not limited in particular as long as it has a mass. The object 1 may be therefore either a conductor, an insulator, or a semiconductor.

(Piezoelectric Sensor Unit 12)

The piezoelectric sensor 12 includes a plurality of piezoelectric elements 21. The piezoelectric elements 21 are passive elements making use of the piezoelectric effect, which converts force applied to a piezoelectric body thereof into voltage. The piezoelectric elements 21 convert the pressure corresponding to the mass of the object 1 into an electric signal and output the electric signal. The electric signal is subjected to A/D conversion in the obtaining unit 13, and is stored in the obtaining unit 13 as a mass distribution of the object 1 on the mounting surface of the piezoelectric sensor 12.

Figure 2:
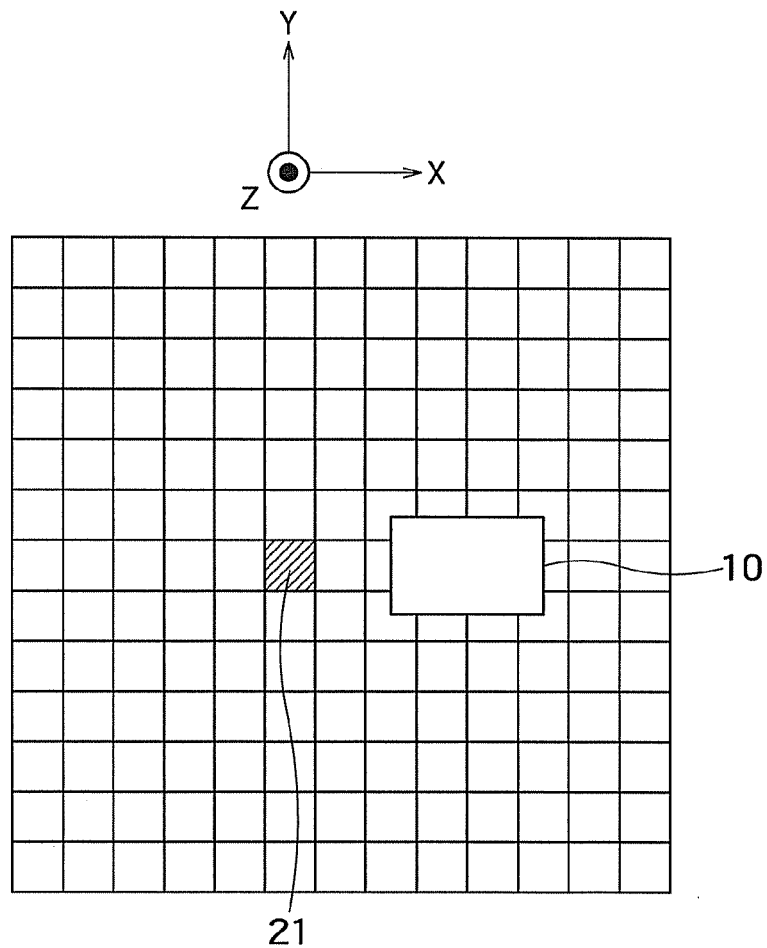
FIG. 2 is a plan view schematically showing a configuration example of a piezoelectric sensor 12.

FIG. 2 is a plan view schematically showing a configuration example of the piezoelectric sensor 12. The piezoelectric sensor 12 has a planar shape being, for example, a rectangular having a size of 5 cm×5 cm. The piezoelectric sensor unit 12 is configured by a plurality of piezoelectric elements each having a size of, for example, 0.1 μm×0.1 μm. In this case, the piezoelectric sensor unit 12 can detect the position of the object 1 with a resolution of a submicron order.

As described above, the piezoelectric elements 21 convert the pressure corresponding to the mass of the object 1 into an electric signal and output the electric signal. Therefore, no electric charge is applied to the object 1, as the piezoelectric sensor 12 does not use an electron beam or the like. In addition, since the piezoelectric sensor 12 detects the mass of the object 1, the object 1 can be detected without depending on the material of the object 1.

Note that, in FIG. 1 and FIG. 2, a +Z direction is treated as an upward direction, and a −Z direction is treated as a downward direction. For example, as shown in FIG. 1, the positional relationship between the object 1 and the piezoelectric sensor unit 12 is in a state that the object 1 is positioned on the piezoelectric sensor unit 12.

(Obtaining Unit (Calculating Unit) 13)

Referring to FIG. 1 again, the obtaining unit 13 as a calculating unit obtains the electric signal from the piezoelectric sensor unit 12, and calculates position coordinates of the object 1 using the electric signal. In addition, the obtaining unit 13 calculates the amount of misregistration of the object 1 (the amount of drifting) based on the position coordinates of the object 1. To store the position coordinates of the object 1 and the amount of misregistration of the object 1, the obtaining unit 13 includes a memory 51. The details of a process executed by the obtaining unit 13 will be described hereinafter.

(Irradiating Unit 14)

Figure 3:
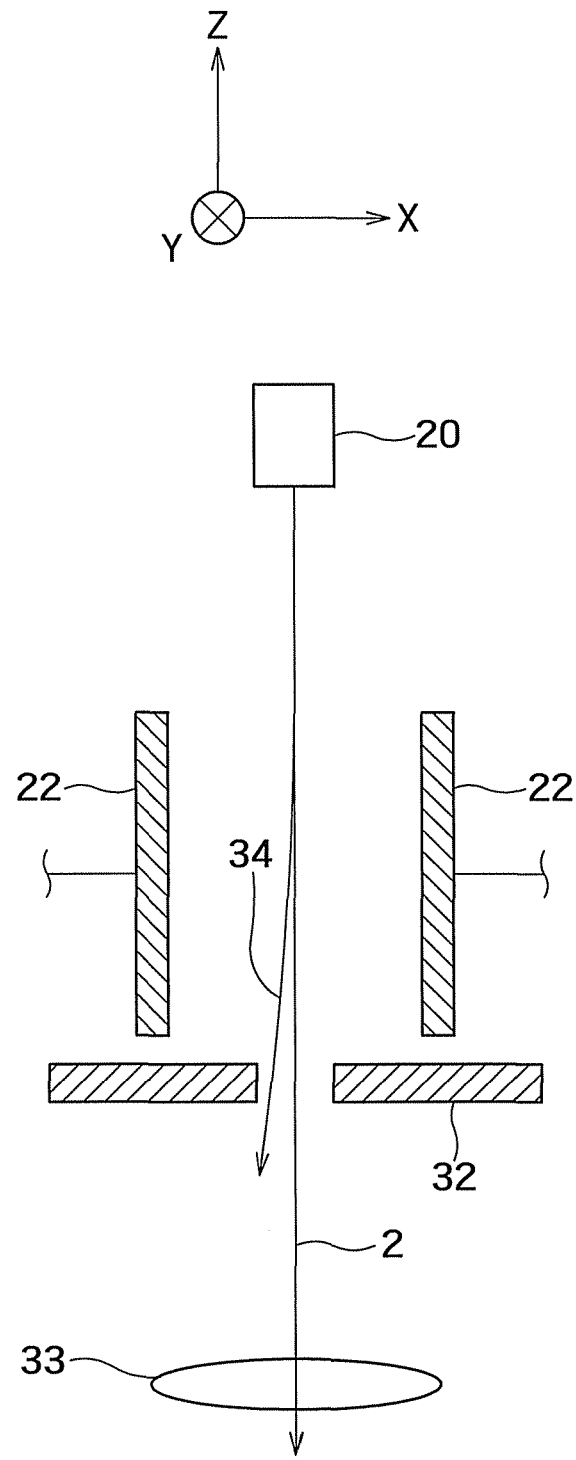
FIG. 3 is a diagram showing an example of the internal configuration of an irradiating unit 14.

The irradiating unit 14 includes a generating unit 20 and an electric field applying unit 22, and irradiates a portion of the object 1 on the piezoelectric sensor unit 12 with the beam 2. For example, FIG. 3 is a diagram showing an example of the internal configuration of the irradiating unit 14. The generating unit 20 supplies, for example, a liquid metal gallium for instance is supplied to a sharp tip of a piece of metal, and generates the beam (FIB) 2 in accordance with a power supply voltage. The beam 2 is accelerated by an acceleration voltage based on the voltage of a power supply unit 35, passes through an aperture of a shielding portion 32, and is condensed by a lens 33 to irradiate the object 1.

The electric field applying unit 22 changes a direction of the beam 2 with an electric field corresponding to the power supply voltage. When the strength of the electronic field of the electric field applying unit 22 is increased, the beam 2 is bent in the manner of beam 34, which can change the position irradiated on the object 1. When the strength of electronic field by the electric field applying unit 22 is further increased, the beam 2 cannot pass through the aperture of the shielding portion 32 and is intercepted by the shielding portion 32. In such a manner, the electric field applying unit 22 can change the position irradiated by the beam 2, as well as intercept the irradiation with the beam 2 in collaboration with the shielding portion 32.

The irradiating unit 14 may further include a shutter (not shown) for shielding the beam 2. In this case, the irradiating unit 14 can suspend or intercept the irradiation with the beam 2 by closing the shutter.

(Moving Unit 23)

The moving unit 23 can move the position of the irradiating unit 14 under the control of the controlling unit 15. For example, the moving unit 23 drives a motor (not shown) to move the irradiating unit 14 in an X or Y direction. Alternatively, the moving unit 23 may change the direction of the irradiating unit 14. In such a manner, the moving unit 23 can change the position irradiated by the beam 2 by moving the irradiating unit 14 itself.

Note that the moving unit 23 uses a mechanical motor to move the irradiating unit 14, whereas the electric field applying unit 22 uses an electronic field to change the direction of the beam 2. As a result, it can be considered that the electric field applying unit 22 can adjust the position irradiated by the beam 2 more minutely than the moving unit 23. In contrast, it can be considered that the moving unit 23 can adjust the position irradiated by the beam 2 within a broader range than the electric field applying unit 22.

(Controlling Unit 15)

Referring to FIG. 1 again, the controlling unit 15 controls the operations of each component of the processing apparatus. The controlling unit 15 stores various application software or the like including a program for controlling each component of the processing apparatus. For this reason, the controlling unit 15 may be configured by, for example, a CPU, a memory, and the like. The controlling unit 15 controls the irradiating unit 14 in accordance with the amount of misregistration of the object 1, or controls the moving unit 23. The irradiating unit 14 or the moving unit 23 can thereby change the direction of the irradiation with the beam 2 if the object 1 drifts while being processed using the beam 2.

In such a manner, in the processing apparatus according to the first embodiment, the obtaining unit 13 calculates the amount of misregistration of the object 1 on the basis of the signal from the piezoelectric sensor unit 12 during the irradiation with the beam 2. The controlling unit 15 then controls the irradiating unit 14 or the moving unit 23 in accordance with the amount of misregistration calculated by the obtaining unit 13. The processing apparatus can thereby correct the position irradiated by the beam 2 so as to reduce the amount of misregistration of the object 1 when the object 1 drifts. As a result, the processing apparatus can irradiate a desired position on the object 1 to be processed with the beam 2.

In addition, the processing apparatus can suspend for a while or intercept the irradiation with the beam 2 when the object 1 drifts. The processing apparatus can thereby suspend processing to a portion of the object 1 which should not be processed.

Furthermore, the processing apparatus according to the first embodiment detects the position of the object 1 using the piezoelectric sensor 12. Since the mass of the object 1 is detected by the piezoelectric sensor 12, the object 1 can be detected without depending on the material of the object 1.

(2) Processing Method According to First Embodiment

Figure 4:
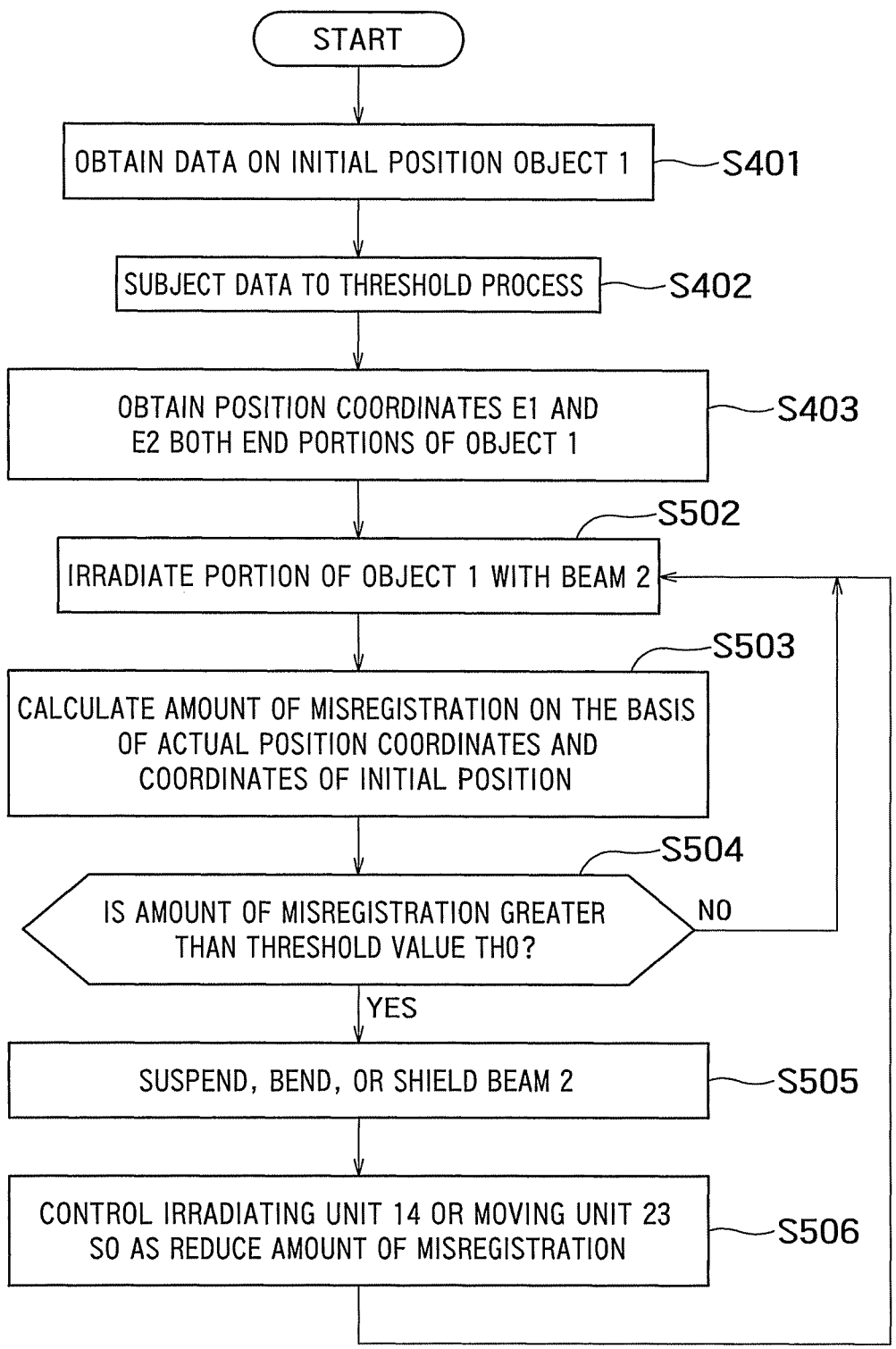
FIG. 4 is a flow chart showing an example of a processing method according to the first embodiment.
Figure 5:
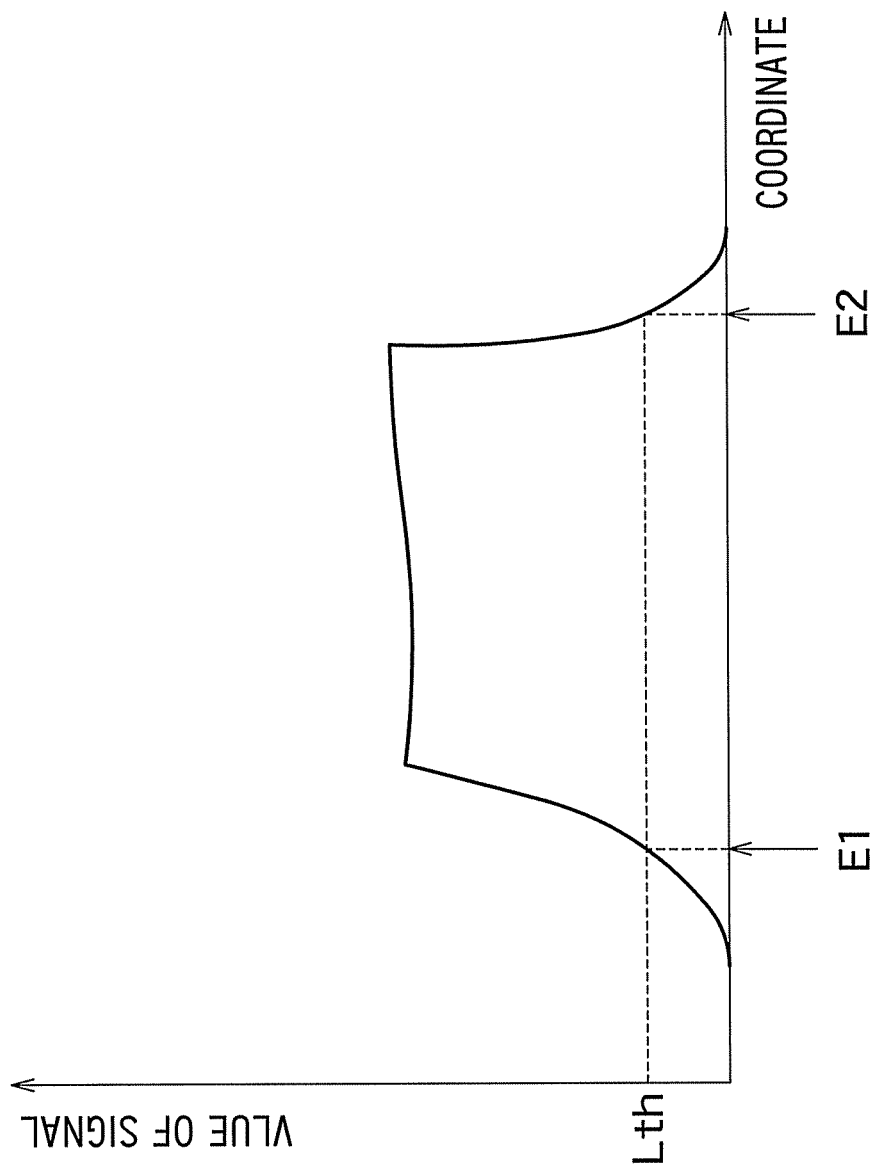
FIG. 5 is a graph showing positional information on an object 1 obtained by using a piezoelectric sensor unit 12.

FIG. 4 is a flow chart showing an example of a processing method according to first embodiment. FIG. 5 is a graph showing positional information on the object 1 obtained using the piezoelectric sensor unit 12. In the graph in FIG. 5, a horizontal axis denotes an X or Y coordinate of the piezoelectric sensor unit 12, and a vertical axis denotes the value of the electric signal representing the weight of the object 1.

First, the object 1 is mounted on the piezoelectric sensor unit 12. The obtaining unit 13 obtains data on the initial position of the object 1 on the piezoelectric sensor unit 12, and stores the data in the storage 27 (step S401). Next, the obtaining unit 13 subjects the data to a threshold process (step S402). The threshold process is a process which reduces values of electric signals from less than or equal to a predetermined threshold value to zero, and which is executed to remove fluctuant components such as random noise. For example, assume that the threshold value is a signal level Lth in the graph in FIG. 5. In this case, the obtaining unit 13 sets the signal level Lth at zero, and obtains coordinates E1 and E2 as position coordinates of both end portions of the object 1 (step S403).

The position coordinates of the object 1 are obtained in a two-dimensional manner in a plane of the piezoelectric sensor unit 12. For example, assuming that the piezoelectric elements 21 arranged in an X direction shown in FIG. 2 are defined as "device rows" and the piezoelectric elements 21 arranged in a Y direction are defined as "device columns," steps S401 to 403 are executed for each device row and for each device column. The obtaining unit 13 can thereby obtain the coordinates of the outer edge of the object 1 in a two-dimensional manner.

Next, the irradiating unit 14 irradiates a portion of the object 1, which should be irradiated with the beam 2, with the beam 2 (step S502). The irradiating unit 14 continues the irradiation with the beam 2 until being controlled to suspend the irradiation by the controlling unit 15.

During the irradiation with the beam 2, the obtaining unit 13 repeats step S401 to step S403 to periodically obtain the position coordinates (actual position coordinates) of the end portions of the object 1. The obtaining unit 13 then calculates the amount of misregistration (a first amount of misregistration) on the basis of the actual position coordinates of the end portions of the object 1 and the coordinates of initial positions of the end portions of the object 1 (step S503). The obtaining unit 13 may determine the difference between the actual position coordinates and the coordinates of the initial positions as the amount of misregistration of the object 1. In addition, since the coordinates of the outer edge of the object 1 are obtained in a two-dimensional manner, the obtaining unit 13 can calculate the amount of misregistration of the object 1 in an X-Y plane.

Next, the controlling unit 15 receives the amount of misregistration from the obtaining unit 13, and determines whether the misregistration of the object 1 occurs or not (step S504). The determination of the misregistration of the object 1 is performed by comparing the amount of misregistration calculated by the obtaining unit 13 with a preset threshold value Th0.

If the absolute value of the amount of misregistration is less than the threshold value Th0 (NO at S504), the controlling unit 15 determines that the misregistration does not occur. In this case, the controlling unit 15 repeats step S502 to step S504.

On the other hand, if the absolute value of the amount of misregistration is greater than or equal to the threshold value Th0 (YES at S504), the controlling unit 15 determines that the misregistration occurs. In this case, the controlling unit 15 controls the irradiating unit 14 to suspend the irradiation with the beam 2 (step S505). Alternatively, the controlling unit 15 may control the electric field applying unit 22 to change the direction of the beam 2 so as to bend (deflect) the beam 2 from the aperture of the shielding portion 32 in FIG. 3. In the case where the irradiating unit 14 includes the shutter for shielding the beam 2, the irradiating unit 14 may close the shutter to shield the beam 2. Furthermore, the controlling unit 15 may merely reduce the output of the beam 2, instead of suspending the irradiation with the beam 2. In such a manner, if it is determined that the misregistration (drift) of the object 1 occurs, the controlling unit 15 suspends, bends, or shields the beam 2. The processing apparatus according to the present embodiment thereby does not damage an area of the object 1 which is not to be processed. The following description will be made with reference to suspending the beam 2, but the descriptions of the bending, shielding, or reducing the beam 2 will be omitted.

Next, the controlling unit 15 controls the irradiating unit 14 or the moving unit 23 so as to reduce the amount of misregistration in accordance with the amount of misregistration of the object 1 (step S506). For example, the controlling unit 15 corrects the amount of misregistration by changing the position of the irradiating unit 14, and moves the beam 2 to a desired position on the object 1. Alternatively, the irradiating unit 14 changes the direction of the beam 2 with the electric field applying unit 22 to correct the amount of misregistration, so as to move the beam 2 to the desired position on the object 1. The irradiating unit 14 then resumes the irradiation with the beam (step S502).

The processing apparatus according to the present embodiment reduces (corrects) the misregistration of the object 1 with the moving unit 23 or the irradiating unit 14 if a drift phenomenon occurs due to such as the difference between temperatures of the object 1 and the stage 11. The processing apparatus can therefore irradiate a desired position on the object 1 with the beam 2 while preventing a portion of the object 1 from being unintendedly processed. The processing apparatus can thereby perform processing with higher precision.

In addition, since the processing apparatus according to the present embodiment suspends for a while or shields the beam if the misregistration occurs, the processing apparatus can suspend the beam without continuing to process a wrong portion of the object 1.

In the first embodiment, the size or the number of piezoelectric elements 21 may be altered in accordance with the beam diameter of the beam 2. In this case, as the beam diameter of the beam 2 becomes larger, the piezoelectric element 21 may have a larger size. The resolution of the piezoelectric sensor 12 can be thereby adapted to the beam diameter of the beam 2. By adapting the resolution of the piezoelectric sensor 12 to the beam diameter of the beam 2, it is possible to prevent an excessive increase in the amount of data output by the piezoelectric sensor unit 12, enhance the processing speed of the obtaining unit 13, and reduce the memory usage of the obtaining unit 13.

Modification of First Embodiment

Figure 6:
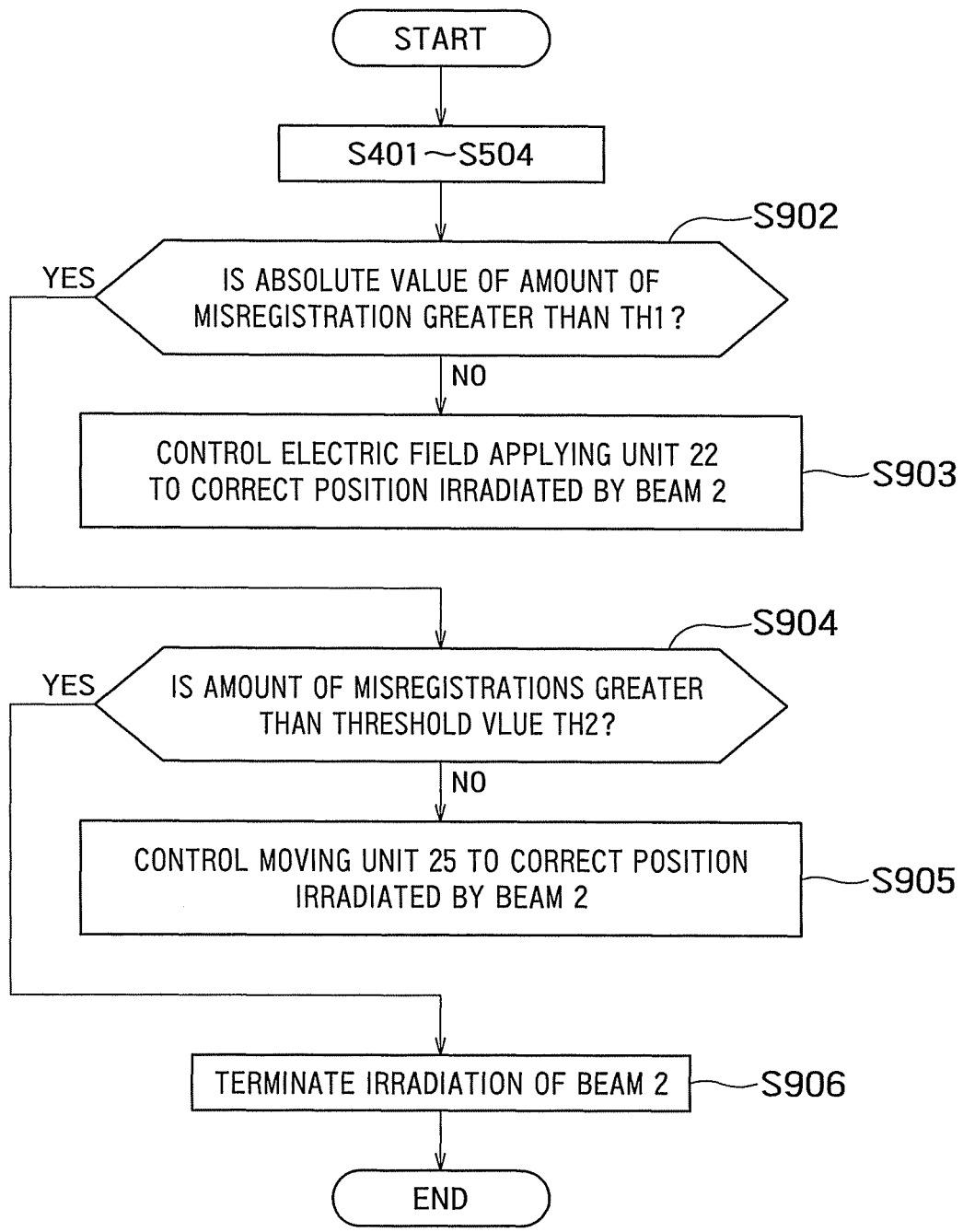
FIG. 6 is a flow chart showing an example of a processing method according to a modification of the first embodiment.

FIG. 6 is a flow chart showing an example of a processing method according to a modification of the first embodiment. In the first embodiment, there is only one threshold value Th0 that is set to the amount of misregistration. In contrast, in the present modification, a plurality of threshold values is set to the amount of misregistration. The number of the threshold values used in the present modification is three (Th0 to Th2), for example. The threshold values Th0 to Th2 have the relationship of Th0<Th1<Th2. First, steps S401 to S504 shown in FIG. 4 are executed. If the controlling unit 15 determines that the misregistration occurs (YES at S504), step S902 and the subsequent steps shown in FIG. 6 are executed.

In the case where the controlling unit 15 determines that the misregistration of the object 1 occurs (the amount of misregistration >Th0) whereas the absolute value of the amount of misregistration is less than or equal to Th1 (NO at step S902), the controlling unit 15 suspends for a while or shields the irradiation of the object 1 with the beam 2, and controls the electric field applying unit 22 to correct the position irradiated by the beam 2 (step S903). In this case, since the electric field applying unit 22 corrects the position irradiated by the beam 2, fine adjustment can be made to the position irradiated by the beam 2. After the correction of the position irradiated by the beam 2, the irradiating unit 14 resumes the irradiation with beam 2.

If the absolute value of the amount of misregistration is greater than the threshold value Th1 (YES at step S902), the controlling unit 15 compares the amount of misregistration with the threshold value Th2 (step S904). If the amount of misregistration is less than or equal to the threshold value Th2 (NO at step S904), the controlling unit 15 suspends the irradiation of the object 1 with the beam 2 for a while, and controls the moving unit 23 to correct the position irradiated by the beam 2 (step S905). In this case, since the moving unit 23 corrects the position irradiated by the beam 2, the position irradiated by the beam 2 can be corrected within a broad range. It is needless to say that the controlling unit 15 may at this point correct the position irradiated by the beam 2 with the moving unit 23 as well as the electric field applying unit 22. The position irradiated by the beam 2 can be thereby corrected within a broad range and the fine adjustment can be also made. After the correction of the position irradiated by the beam 2, the irradiating unit 14 resumes the irradiation with the beam 2.

If the amount of misregistration is greater than the threshold value Th2 (YES at step S904), the controlling unit 15 determine that the amount of misregistration cannot be corrected with the moving unit 23 and the electric field applying unit 22, and terminates the irradiation of the object 1 with the beam 2 (S906). In this case, an operator may correct the position of the object 1.

In such a manner, the processing apparatus according to the present modification determines the amount of misregistration using the plurality of threshold values Th0 to Th2, and controls the moving unit 23 and the electric field applying unit 22 in accordance with the amount of misregistration. It is thereby possible for the processing apparatus to correct the position irradiated by the beam 2 within a broad range and/or make the fine adjustment.

Note that, in the above-described embodiment and modification, the obtaining unit 13 calculates the amount of misregistration of the object 1 on the basis of position coordinates of the outer edge (end portions) of the object 1. However, the obtaining unit 13 may calculate the amount of misregistration of the object 1 based on the position coordinates of the center of gravity of the object 1. In this case, the obtaining unit 13 may obtain an actual position of the center of gravity of the object 1 from the piezoelectric sensor unit 12, and calculate the difference between the actual position of the center of gravity and the initial position of the center of gravity of the object 1 that has been stored in advance, as the amount of misregistration.

Second Embodiment

Figure 7:
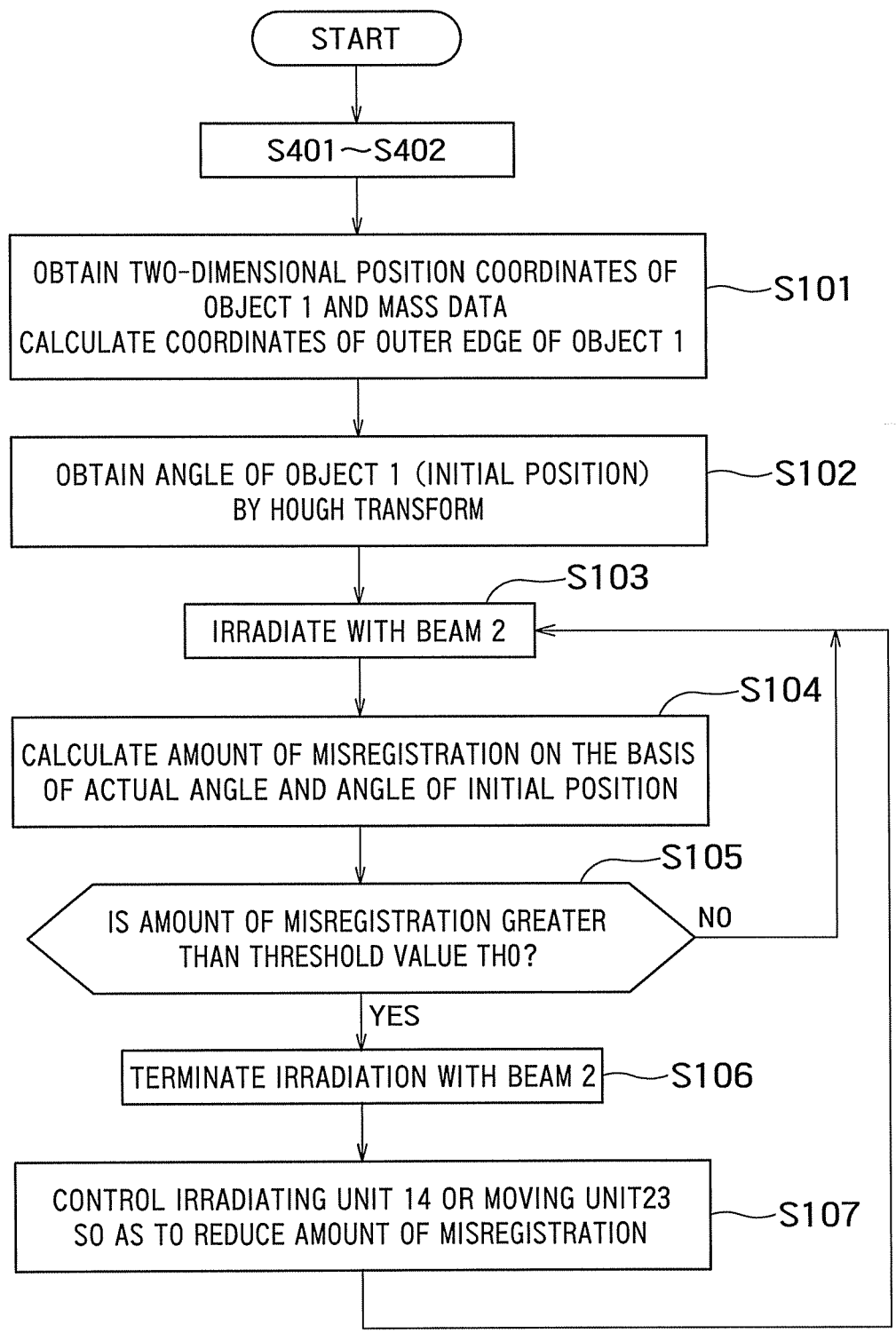
FIG. 7 is a flow chart showing a processing method according to a second embodiment.

FIG. 7 is a flow chart showing a processing method according to a second embodiment. The processing apparatus according to the second embodiment determines a rotation angle as the amount of misregistration based on the position coordinates of the center of gravity of the object 1. The processing apparatus according to the second embodiment may have the same configuration similar to that of the processing apparatus according to the first embodiment, thus the illustration thereof will be omitted.

First, the obtaining unit 13 executes steps S401 and S402 in FIG. 4 to obtain two-dimensional position coordinates of the object 1 and mass data corresponding to the position coordinates from the piezoelectric sensor unit 12 (S101). Next, the obtaining unit 13 subjects the two-dimensional position coordinates of the object 1 and the mass data to the threshold process, and thereafter calculates the center of gravity of the object 1. The position coordinates of the center of gravity are stored in the memory 51. In addition, the obtaining unit 13 also calculates the coordinates of the outer edge of the object 1. The coordinates of the outer edge are also stored in the memory 51.

Next, the obtaining unit 13 calculates a line passing through given coordinates of the outer edge using the center of gravity of the object 1 as a reference point, by so-called Hough transform. Since the Hough transform is a process generally used for extracting lines, the description thereof will be therefore omitted. Using the Hough transform allows for extracting a plurality of lines passing through a plurality of end portions. The plurality of lines are each calculated as a distance from the center of gravity (reference point) to the line and an angle with respect to the center of gravity (reference point). The obtaining unit 13 stores the angles obtained by the Hough transform as an initial position in the memory 51 (step S102).

Next, the irradiating unit 14 irradiates a portion of the object 1, which should be irradiated with the beam 2, with the beam 2 (step S103). The obtaining unit 13 repeats step S101 to step S102 during the irradiation with the beam 2 to periodically obtain a rotation angle of the object 1. The obtaining unit 13 then calculates the amount of misregistration (a first amount of misregistration) on the basis of an actual angle of the object 1 and the angle of the initial position of the object 1 (step S104).

The obtaining unit 13 may determine the difference between the actual angle and the angle in the initial position as the amount of misregistration of the object 1.

Next, the controlling unit 15 receives the amount of misregistration from the obtaining unit 13, and determines whether the misregistration of the object 1 occurs or not (step S105). The determination of the misregistration of the object 1 is performed by comparing the amount of misregistration calculated by the obtaining unit 13 with a preset threshold value Th0.

If the absolute value of the amount of misregistration is less than the threshold value Th0 (NO at S105), the controlling unit 15 determines that the misregistration does not occur. In this case, the controlling unit 15 repeats step S103 to step S105.

On the other hand, if the absolute value of the amount of misregistration is greater than or equal to the threshold value Th0 (YES at S105), the controlling unit 15 determines that the misregistration occurs. In this case, the controlling unit 15 controls the irradiating unit 14 to suspend the irradiation with the beam 2 (step S106).

Next, the controlling unit 15 controls the irradiating unit 14 or the moving unit 23 so as to reduce the amount of misregistration of the object 1 in accordance with the amount of misregistration (step S107). For example, the controlling unit 15 corrects the amount of misregistration by changing the position of the irradiating unit 14 using the position coordinates of the center of gravity or the rotation angle of object 1, and moves the beam 2 to a desired position on the object 1. Alternatively, the irradiating unit 14 changes the direction of the beam 2 with the electric field applying unit 22 to correct the amount of misregistration, and moves the beam 2 to the desired position on the object 1. The irradiating unit 14 then resumes the irradiation with the beam (step S103).

In such a manner, in the processing apparatus according to the second embodiment, the obtaining unit 13 can obtain an actual position of the object 1, and calculate the rotation angle of the object 1 from the actual position of the object 1 and the initial position of the object 1 that has been stored in advance, by using the Hough transform, as the amount of misregistration. The processing apparatus controls the irradiating unit 14 or the moving unit 23 so as to reduce such an amount of misregistration of rotation angle. The second embodiment can thereby deal with the misregistration of the rotation angle of the object 1. Naturally, the second embodiment may be combined with the first embodiment and/or the above-described modification thereof.

Third Embodiment

Figure 8:
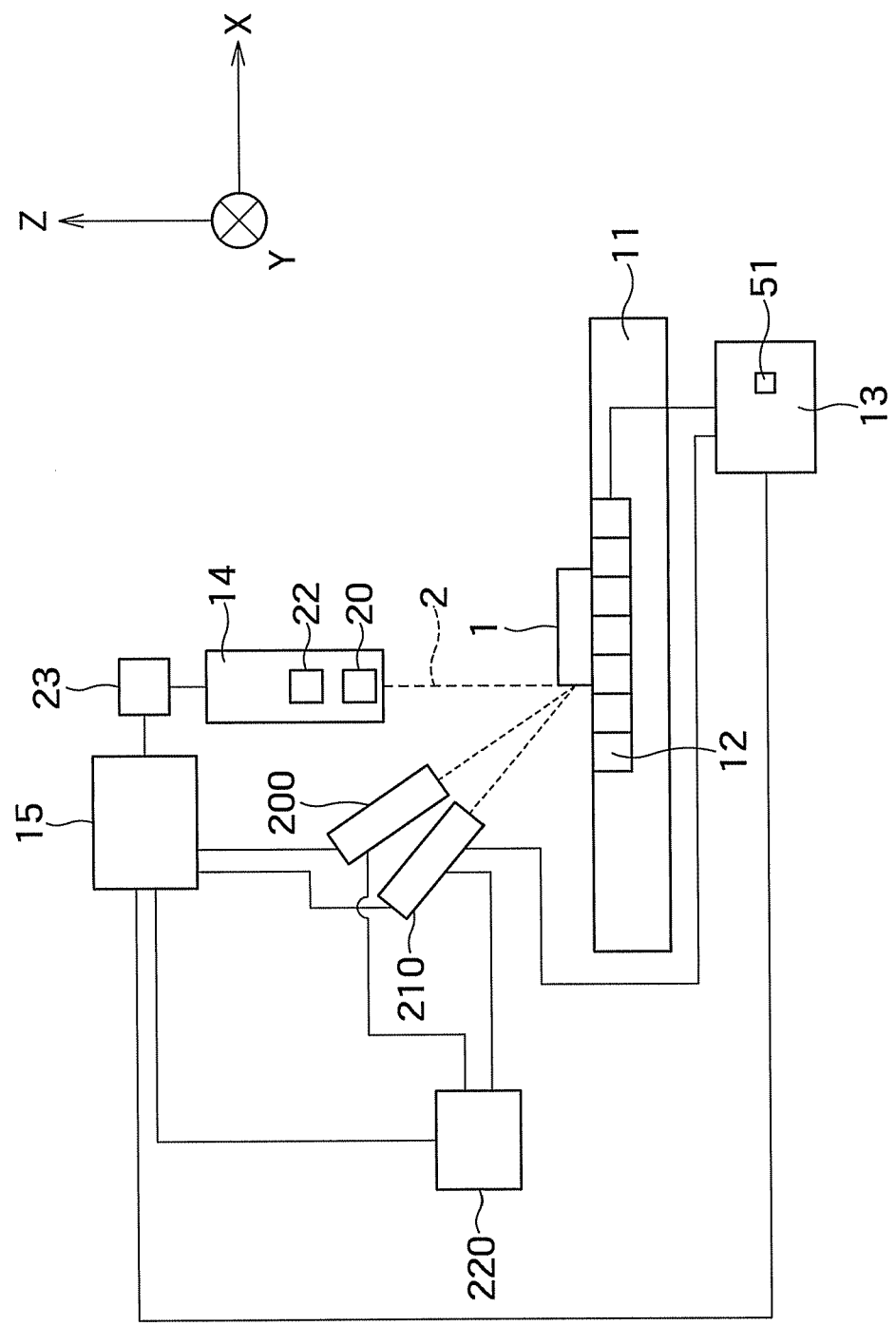
FIG. 8 is a diagram showing an example of the configuration of a processing apparatus according to a third embodiment.

FIG. 8 is a diagram showing an example of the configuration of a processing apparatus according to a third embodiment. The processing apparatus according to the third embodiment further includes an X-ray irradiating unit 200 and an X-rays sensor 210 as a reflected wave sensor. Other parts of the configuration of the third embodiment may be similar to those corresponding to the first embodiment.

As a function to enhance the process precision of the obtaining unit 12, the X-ray irradiating unit 200 irradiates the object 1 with X-rays. The object 1 irradiated with the X-rays interacts with the X-rays to emit fluorescent X-rays by the photoelectric effect. A fluorescent X-ray has a unique energy for each of the element. As a result, the object 1 and the stage 11 emit fluorescent X-rays the energies of which differ from each other. For this reason, the X-rays sensor 210 can detect the fluorescent X-rays from the object 1.

The X-rays sensor 210 detects the fluorescent X-rays from the object 1 as a two-dimensional image. A sensitivity of the X-rays sensor 210 to the fluorescent X-rays from the object 1 is higher than that to the fluorescent X-rays from the stage 11. The X-rays sensor 210 can thereby extract the fluorescent X-rays from the object 1.

The moving unit 220 can move the positions of the X-ray irradiating unit 200 and the X-rays sensor 210 under the control of the controlling unit 15. For example, the moving unit 220 drives a motor (not shown) to move the X-ray irradiating unit 200 and the X-rays sensor 210 in an X or Y direction. Alternatively, the moving unit 220 may change the directions of the X-ray irradiating unit 200 and the X-rays sensor 210. In such a manner, the moving unit 220 can change the position irradiated by the X-rays by moving the X-ray irradiating unit 200 and the X-rays sensor 210 themselves.

The fluorescent X-rays detected by the X-rays sensor 210 can be used for obtaining the amount of misregistration (a second amount of misregistration) of the object 1, together with or instead of the beam 2. In this case, the positional information on the end portions of the object 1 based on the fluorescent X-rays is transmitted to the obtaining unit 13. The obtaining unit 13 calculates the amount of misregistration of the object 1 from the difference between the initial position and the actual position of the object 1. The moving unit 23 moves the irradiating unit 14 and/or the moving unit 23 on the basis of the amount of misregistration of the object 1. The moving unit 220 moves the X-ray irradiating unit 200 and the X-rays sensor 210.

In such a manner, in the processing apparatus according to the third embodiment, the obtaining unit 13 calculates the amount of misregistration of the object 1 on the basis of the signals from the piezoelectric sensor unit 12 and/or the fluorescent X-rays from the X-rays sensor 210 during the irradiation with the beam 2. The controlling unit 15 then controls the irradiating unit 14, the moving unit 23, the X-ray irradiating unit 200, or the X-rays sensor 210 in accordance with the first amount of misregistration and/or the second amount of misregistration calculated by the obtaining unit 13. The processing apparatus according to the third embodiment can thereby correct the position irradiated by the beam 2 or the X-rays so as to reduce the amount of misregistration of the object 1 when the object 1 drifts. As a result, the processing apparatus can irradiate a desired position on the object 1 to be processed with the beam 2. In addition, the processing apparatus can accurately detect the position of the object 1.

Other operations of the third embodiment may be similar to those of the first embodiment. The controlling unit 15 can therefore reduce the amount of misregistration with the moving units 23 and 220. The third embodiment can further acquire the effects of the first embodiment. The third embodiment may be used in combination with the modification of the first embodiment, or the second embodiment.

Furthermore, the X-ray irradiating unit 200 and the X-rays sensor 210 according to the third embodiment may be provided together with the piezoelectric sensor unit 12 or may be provided instead of the piezoelectric sensor unit 12.

Furthermore, the X-rays from the X-ray irradiating unit 200 may be used for, as with the beam 2, processing the object 1.

Furthermore, the X-ray irradiating unit 200 may be a radio wave irradiating unit which generates radio waves or an acoustic wave irradiating unit which generates acoustic waves. In this case, the X-rays sensor 210 is a radio wave sensor or an acoustic wave sensor. That is, the irradiating unit 200 may emit some kind of waves, and the sensor 210 may detect the reflected waves thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A processing apparatus, comprising:
   a piezoelectric sensor unit on which an object is mounted and that outputs an electric signal corresponding to a pressure due to a weight of the object;
   an irradiating unit that irradiates a portion of the object on the piezoelectric sensor unit with a beam so as to process the portion of the object;
   a calculating unit that, during irradiation with the beam by the irradiation unit, calculates a first amount of misregistration between the portion of the object which should be irradiated with the beam and an actual position irradiated by the beam based on the electric signal from the piezoelectric sensor unit;
   a moving unit that moves the irradiating unit; and
   a controlling unit that controls the irradiating unit or the moving unit in accordance with the first amount of misregistration.

2. The processing apparatus according to claim 1, wherein the controlling unit controls the irradiating unit so as to reduce the first amount of misregistration.

3. The processing apparatus according to claim 1, wherein the controlling unit reduces an output of the beam from the irradiating unit or suspends the irradiation with the beam in accordance with the first amount of misregistration.

4. The processing apparatus according to claim 1, wherein the calculating unit obtains an actual position of an end portion of the object from the piezoelectric sensor unit, and calculates a difference, as the first amount of misregistration, between the actual position of the end portion and an initial position of the end portion that has been stored in advance.

5. The processing apparatus according to claim 1, wherein the calculating unit obtains an actual position of a center of gravity of the object from the piezoelectric sensor unit, and calculates a difference, as the first amount of misregistration, between the actual position of the center of gravity and an initial position of the center of gravity of the object that has been stored in advance.

6. The processing apparatus according to claim 1, wherein the calculating unit obtains an actual position of the object from the piezoelectric sensor unit, and calculates a rotation angle of the object as the first amount of misregistration based on the actual position of the object and an initial position of the object that has been stored in advance.

7. The processing apparatus according to claim 1, wherein the controlling unit moves the irradiating unit using the moving unit so as to reduce the first amount of misregistration.

8. The processing apparatus according to claim 1, wherein:
the irradiating unit includes an electric field applying unit that bends the beam, and
the controlling unit bends the beam using the electric field applying unit so as to reduce the first amount of misregistration.

9. The processing apparatus according to claim 1, further comprising:
a reflected wave sensor unit that detects at least one of an X-ray, a radio wave, and an acoustic wave reflected by the object,
wherein the calculating unit obtains a second amount of misregistration of the object based on an output signal from the reflected wave sensor unit.

10. The processing apparatus according to claim 9, further comprising:
a moving unit that moves the irradiating unit,
wherein the controlling unit reduces the second amount of misregistration using the moving unit.

11. The processing apparatus according to claim 9, wherein:
the irradiating unit includes an electric field applying unit that bends the beam and,
the controlling unit reduces the second amount of misregistration using the electric field applying unit.

12. A processing method, comprising:
mounting an object on a piezoelectric sensor unit that outputs an electric signal corresponding to a pressure due to a weight of the object;
irradiating, from an irradiating unit, a portion of the object with a beam so as to process the portion of the object;
calculating, in a calculating unit, a first amount of misregistration between the portion of the object which should be irradiated with the beam and an actual position irradiated by the beam based on the electric signal from the piezoelectric sensor unit, the calculating being performed during irradiation with the beam by the irradiating unit; and
controlling, in a controlling unit, the irradiating unit in accordance with the first amount of misregistration.

13. The processing method according to claim 12, wherein the irradiating unit is controlled so as to reduce the first amount of misregistration.

14. The processing method according to claim 12, wherein the irradiating unit reduces an output of the beam or suspends irradiation with the beam if the first amount of misregistration is greater than or equal to a predetermined value.

15. The processing method according to claim 12, wherein the first amount of misregistration is a difference between an actual position of an end portion of the object and an initial position of the end portion that has been stored in advance.

16. The processing method according to claim 12, wherein the first amount of misregistration is a difference between an actual position of a center of gravity of the object and an initial position of the center of gravity of the object that has been stored in advance.

17. The processing method according to claim 12, wherein the first amount of misregistration is a rotation angle of the object calculated based on an actual position of an end portion of the object and an initial position of the end portion that has been stored in advance.

18. The processing method according to claim 12, wherein the controlling unit moves the irradiating unit so as to reduce the first amount of misregistration.

19. The processing method according to claim 12, wherein the controlling unit bends the beam so as to reduce the first amount of misregistration.

* * * * *